United States Patent
Litvinov et al.

(10) Patent No.: US 9,818,535 B2
(45) Date of Patent: Nov. 14, 2017

(54) SYSTEMS AND METHODS FOR LOCALLY REDUCING OXIDES

(71) Applicants: Dmitri Litvinov, Friendswood, TX (US); Long Chang, Pearland, TX (US)

(72) Inventors: Dmitri Litvinov, Friendswood, TX (US); Long Chang, Pearland, TX (US)

(73) Assignee: UNIVERSITY OF HOUSTON SYSTEM, Houston, TX (US)

( * ) Notice: Subject to any disclaimer, the term of this patent is extended or adjusted under 35 U.S.C. 154(b) by 100 days.

(21) Appl. No.: 14/592,152

(22) Filed: Jan. 8, 2015

(65) Prior Publication Data

US 2015/0194261 A1 Jul. 9, 2015

Related U.S. Application Data

(60) Provisional application No. 61/924,933, filed on Jan. 8, 2014, provisional application No. 61/977,909, filed on Apr. 10, 2014.

(51) Int. Cl.

| | |
|---|---|
| *B05D 5/12* | (2006.01) |
| *H01F 41/22* | (2006.01) |
| *G11B 5/65* | (2006.01) |
| *G11B 5/855* | (2006.01) |
| *H01F 10/12* | (2006.01) |
| *C23C 14/00* | (2006.01) |
| *C23C 14/08* | (2006.01) |
| *C23C 14/58* | (2006.01) |

(Continued)

(52) U.S. Cl.
CPC ......... *H01F 41/22* (2013.01); *C23C 14/0036* (2013.01); *C23C 14/085* (2013.01); *C23C 14/5806* (2013.01); *C23C 14/5846* (2013.01); *G11B 5/65* (2013.01); *G11B 5/855* (2013.01); *H01F 10/123* (2013.01); *H01F 10/14* (2013.01); *H01F 10/16* (2013.01)

(58) Field of Classification Search
USPC ....................................................... 427/126.3
See application file for complete search history.

(56) References Cited

U.S. PATENT DOCUMENTS

| | | | |
|---|---|---|---|
| 5,082,749 A | 1/1992 | Carcia | |
| 5,328,811 A * | 7/1994 | Brestel | ..................... B41M 5/26 430/203 |
| 6,054,331 A | 4/2000 | Woo et al. | |

(Continued)

FOREIGN PATENT DOCUMENTS

JP 03-268247 11/1991

*Primary Examiner* — Austin Murata
(74) *Attorney, Agent, or Firm* — Winstead PC

(57) ABSTRACT

In the systems and methods for synthesizing a thin film with desired properties (e.g. magnetic, conductivity, photocatalyst, etc.), a metal oxide film may be deposited on a substrate. The metal oxide film may be achieved utilizing any suitable method. A reducing agent may be deposited before, after or both before and after the metal oxide layer. Oxygen may be removed or liberated from the deposited metal oxide film by low temperature local or global annealing. As a result of the annealing to remove oxygen, one or more portions of the metal oxide may be transformed into materials with desired properties. As a nonlimiting example, a metal oxide film may be treated to provide a magnetic multilayer film that is suitable for bit patterned media.

22 Claims, 4 Drawing Sheets

(51) Int. Cl.
　　　*H01F 10/14*　　　(2006.01)
　　　*H01F 10/16*　　　(2006.01)

(56) References Cited

U.S. PATENT DOCUMENTS

| | | |
|---|---|---|
| 6,162,532 A | 12/2000 | Black et al. |
| 7,220,669 B2 | 5/2007 | Hujanen et al. |
| 7,632,601 B2 | 12/2009 | Adzic et al. |
| 7,732,071 B2 | 6/2010 | Fullerton et al. |
| 8,664,147 B2 | 3/2014 | Bello et al. |
| 2004/0005753 A1* | 1/2004 | Kostamo ............... C23C 16/40 438/222 |
| 2006/0019493 A1 | 1/2006 | Li |
| 2006/0033440 A1* | 2/2006 | Steinmann ............. C03C 4/02 313/636 |
| 2008/0122351 A1* | 5/2008 | Kitazume ........... H01L 51/5234 313/504 |
| 2009/0110807 A1* | 4/2009 | Koenig ................. C23C 14/18 427/69 |
| 2009/0130299 A1* | 5/2009 | Chopra ................ H05K 3/182 427/98.4 |
| 2010/0270710 A1 | 10/2010 | Kang et al. |
| 2012/0302055 A1 | 11/2012 | Pore et al. |
| 2013/0242430 A1 | 9/2013 | Aoyama et al. |

\* cited by examiner

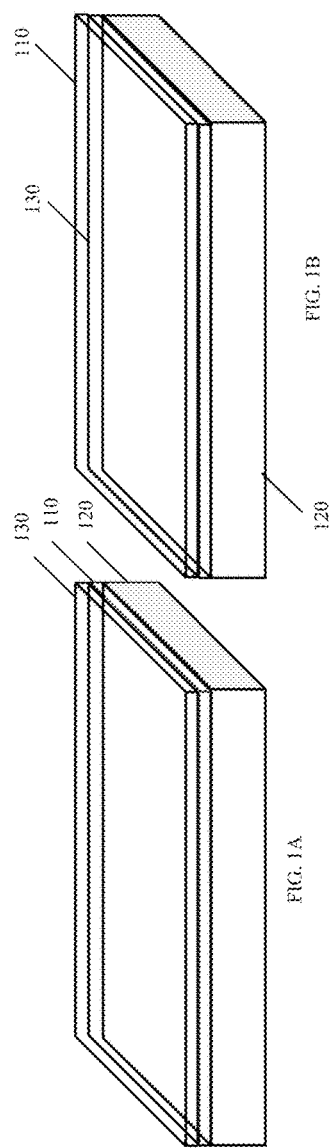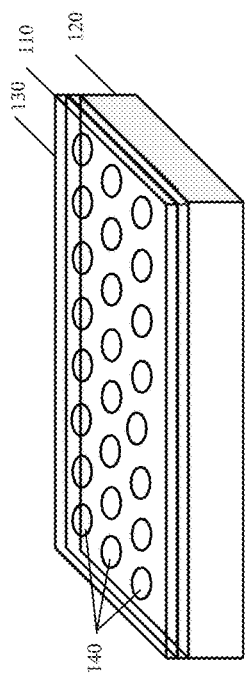

SYSTEMS AND METHODS FOR LOCALLY REDUCING OXIDES

RELATED APPLICATIONS

This application claims the benefit of U.S. Provisional Patent Application Nos. 61/924,933 filed on Jan. 8, 2014 and 61/977,909 filed on Apr. 10, 2014, which are incorporated herein by reference.

STATEMENT REGARDING FEDERALLY SPONSORED RESEARCH

This invention was made with government support under Grant No. CMMI-0927786 (G100922) awarded by the National Science Foundation. The government has certain rights in the invention.

FIELD OF THE INVENTION

This invention relates to locally reducing metal oxides. More particularly, to systems and methods for locally reducing metal oxides to provide materials with desirable properties, such as for the synthesis of magnetic thin films.

BACKGROUND OF INVENTION

Techniques or methods for synthesizing or adjusting materials to achieve desired properties may require costly and/or complicated processing techniques. For example, removing oxygen from a metal oxide may change the properties of the material. As nonlimiting examples, cobalt oxide (CoO) may demonstrate an increased magnetic moment when oxygen is removed, and copper oxide (CuO, $Cu_2O$) may shift from an insulator to a conductor once oxygen is removed.

Magnetic films may be utilized for data storage purposes, such as in magnetic recording media, magnetic random access memory, or the like. CoPd multilayers have been studied for many decades as a candidate material for high density magnetic recording. As an example, some methods may involve: 1) pre-patterning a silicon substrate using directed self-assembly and reactive ion etching; and 2) depositing CoPd film via sputtering. Parameters of such methods are tuned to produce a high quality film, such as seed layer engineering, Co to Pd layer thickness ratio, number of layer repeats, and deposition conditions such as pressure, power, temperature and rate. Researchers have systematically adjusted these parameters to produce high quality CoPd multilayers for bit patterned media (BPM). However, it is still difficult to economically produce films with low enough defect density for BPM.

Thus, there is a desire for systems and methods to locally reduce metal oxides to produce materials with desired properties. The systems and methods for locally reducing metal oxides discussed herein utilize a reducing agent that aids removal of oxygen and low temperature annealing of a metal oxide to produce materials with demonstrating desired properties. In some embodiments, the abovementioned method for locally reducing metal oxides may be utilized to produce quality BPM.

SUMMARY OF THE INVENTION

In one embodiment, a desired thin film is provided with an indirect approach. A metal oxide layer is provided. In some embodiments, the metal oxide layer may be deposited using sputtering, evaporation, CVD, PVD, PLD, ALD, electrodeposition, or any other suitable deposition method. The desired thin film may be provided by annealing the film at low temperatures to remove oxygen. In some embodiments, heat for the annealing may be provided by an oven, laser, lamps, electron beams, ion beams, a hot plate, or the like. In some embodiments, the annealing temperatures are equal to or between 100° C. to 400° C. In some embodiments, the annealing temperatures for localized annealing are equal to or between 100° C. to 500° C. In some embodiments, localized annealing temperatures may be equal to or greater than 100° C. In some embodiments, localized annealing temperatures may be between 100° C. to 1000° C. In some embodiments, localized areas of the metal oxide layer may be heated to provide a desired pattern, such as patterned islands or CoPd islands. In some embodiments, a reducing agent may be deposited on a metal oxide layer to aid removal of oxygen from the metal oxide. Nonlimiting examples of reducing agent(s) may include Ta, Al, Mg, Ca, Zr, Zn, Ti, Si, C, $H_2$, or combinations thereof. The reducing agent may be deposited as a continuous film or patterned/assembled on a substrate. The reducing agent may be deposited before or after the metal oxide layer. In some embodiments, the reducing agent may be deposited both before and after the metal oxide layer.

In another embodiment, a CoOPd film may be deposited on a substrate. A reducing agent layer, for example Ta, may be deposited before, after or both before and after the CoOPd film. The CoOPd film may be annealed at temperatures equal to or between 100° C. to 400° C. In some embodiments, localized areas the CoOPd film may be heated during annealing to provide patterned islands. The resulting film may provide CoPd islands. In some embodiments, the annealing temperatures for localized annealing are equal to or between 100° C. to 500° C. In some embodiments, the annealing temperatures for localized annealing are equal to or between 100° C. to 1000° C. In some embodiments, localized annealing temperatures may be equal to or greater than 100° C. In some embodiments, localized annealing may be performed for a duration equal to or between 0.1 nanoseconds to 24 hours.

The foregoing has outlined rather broadly various features of the present disclosure in order that the detailed description that follows may be better understood. Additional features and advantages of the disclosure will be described hereinafter.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein:

FIGS. 1A-1C an illustrative embodiment of steps for reducing metal oxides;

DETAILED DESCRIPTION

Figure 2:
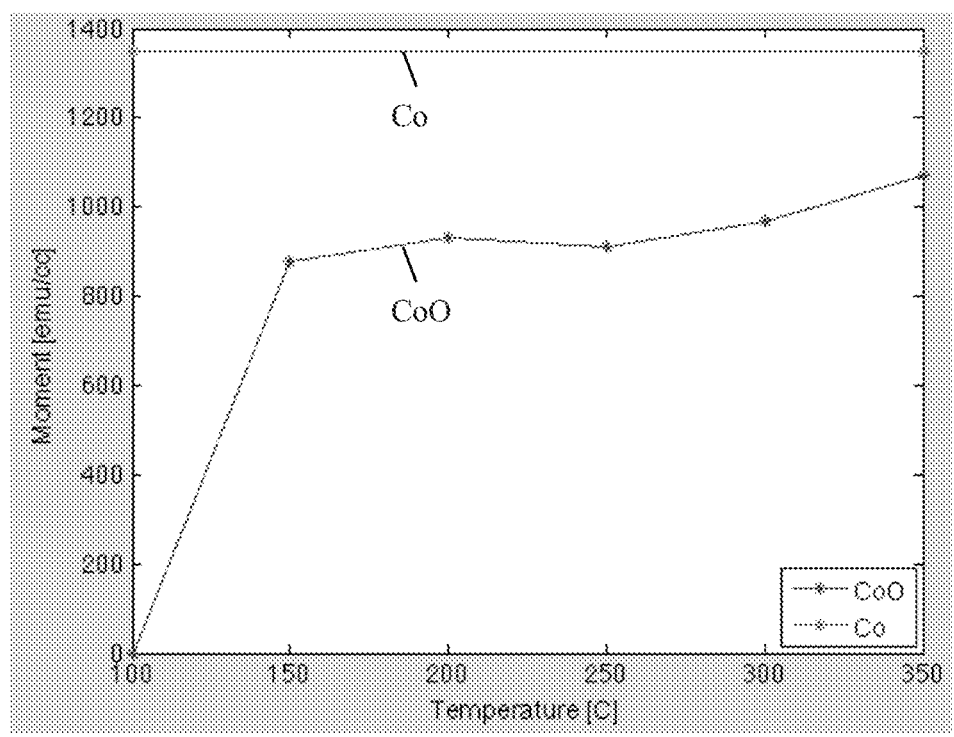
FIG. 2 shows the magnetic moment of Co and CoO films after annealing at various temperatures.

Refer now to the drawings wherein depicted elements are not necessarily shown to scale and wherein like or similar elements are designated by the same reference numeral through the several views.

Referring to the drawings in general, it will be understood that the illustrations are for the purpose of describing particular implementations of the disclosure and are not intended to be limiting thereto. While most of the terms used herein will be recognizable to those of ordinary skill in the art, it should be understood that when not explicitly defined, terms should be interpreted as adopting a meaning presently accepted by those of ordinary skill in the art.

It is to be understood that both the foregoing general description and the following detailed description are exemplary and explanatory only, and are not restrictive of the invention, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

Systems and methods for locally reducing metal oxides are discussed herein. In the synthesis, a metal oxide layer 110 may be deposited on a substrate 120, as shown in FIG. 1A. The metal oxide layer 110 may be deposited a continuous film or patterned film. Deposition of the metal oxide may utilizes sputtering (e.g. in an oxygenated environment), evaporation, chemical vapor deposition (CVD), physical vapor deposition (PVD), pulsed laser deposition (PLD), atomic layer deposition (ALD), electrodeposition, any other deposition techniques, or combinations thereof. In some embodiments, a metal may be deposited utilizing the above-mentioned deposition techniques, and oxidized by annealing, plasma treatment, and/or exposure to oxygen. In some embodiments, the deposited metal oxide layer 110 may be a patterned layer. As a nonlimiting example, the patterned layer may be an array of islands formed in any suitable shape, such as circles, squares, rectangles, ovals, or the like. As another nonlimiting example, the patterned layer may be bilayers stacked one or more times, such as CoO/Pd bilayers stacked multiple times. The metal oxide preferably demonstrates different properties relative to the metal oxide when oxygen is removed, such as by annealing or heating. As a nonlimiting example, suitable metal oxides may include materials that demonstrate magnetic properties when oxygen is removed, such as cobalt oxides, CoO, CoOPd, CoOPt, iron oxide, $Fe_2O_3$, $Fe_3O_4$, nickel oxide, NiO, or the like. Other suitable metal oxides may include materials that demonstrate electric conductivity when oxygen is removed, such as copper oxide, CuO, $Cu_2O$, $TiO_2$, tin oxide, manganese oxide, chromium oxide, silver oxide, molybdenum oxide, or the like.

A reducing agent may be utilized to aid the removal of oxygen from the metal oxide. The reducing agent 130 may be deposited as a continuous film or patterned/assembled on a substrate 120, as shown in FIG. 1A. In some embodiments, the reducing agent 130 may be patterned in the same manner as the metal oxide layer 110 or patterned in the same manner as islands to be formed by removing oxygen. As a nonlimiting example, if the metal oxide layer 110 was patterned as an array of islands, the reducing agent may also be patterned as an array of islands. In the embodiment shown in FIG. 1A, the reducing agent 130 is deposited after the metal oxide layer 110. However, in other embodiments, the reducing agent 130 may be deposited before the metal oxide layer 110 as shown in FIG. 1B. In yet another embodiment, the reducing agent may be deposited both before and after the metal oxide layer. The reducing agent 130 is in close proximity to the metal oxide layer, such as 5 nm or less from the metal oxide layer. For example, in a film comprising CoO(0.3 nm)/Pd(0.7 nm) bilayers stacked 5 times with just Ta above the film, the CoO was converted to Co through 5 layers of Pd. Nonlimiting examples of reducing agent(s) may include Ta, Al, Mg, Ca, Zr, Zn, Ti, Si, C, $H_2$, or combinations thereof. Methods for precision assembly of the reducing agent include, but are not limited to, 1) self-assembly, directed self-assembly, or random scattering of shaped nanoparticles; 2) thermal dewetting of thin films or directed thermal dewetting; 3) patterning by reactive ion etching (RIE) through a mask (e.g. top down approach to semiconductor processing); 4) patterning by milling through a mask; 5) patterning by evaporation on a mask and then lift-off (e.g. bottom up approach to semiconductor processing; or 6) patterning by selective oxidizing the reducing agent through a mask. Removal of residue can be performed after the patterning/assembling process.

In some embodiments, one or more localized areas of the metal oxide film 110 may be heated to remove oxygen, thereby resulting in one or more pattern islands of a desired metal(s) 140 in the metal oxide film, as shown in FIG. 1C. The patterned islands 140 represent localized areas of the metal oxide film 110 where oxygen has been removed or reduce, whereas the untreated regions surround the patterned islands retain their original composition as a metal oxide. As a nonlimiting example, the islands of metal oxide that have been reduced may be an array of islands formed in any suitable shape, such as circles, squares, rectangles, ovals, or the like. In other embodiments, the entirety of the metal oxide film may be heated to remove oxygen (or globally annealing), thereby resulting in a desired metal(s) film. It is anticipated that this localized annealing to pattern the metal oxide film may require higher temperatures than global annealing or annealing the entire metal oxide film. In some embodiments, the annealing temperatures are equal to or between 100° C. to 500° C. In some embodiments, the annealing temperatures are equal to or between 100° C. to 1000° C. In some embodiments, the annealing temperatures may be equal to or greater than 100° C. In some embodiments, the annealing may occur in a controlled non-reactive environment, such as a nitrogen environment, noble gas environment, vacuum environment, and/or other stable gas environments. As nonlimiting examples, any suitable method of generating heat may be utilized, such as an oven, laser, lamps, electron beams, ion beams, a hot plate, or the like. In some embodiments, it may be desirable to preform heating with heat assisted magnetic recording (HAMR) heads to ensure accurate alignment. In some embodiments, localized annealing may be performed for a duration equal to or between 0.1 nanoseconds to 24 hours. In some embodiments, the metal oxide may be annealed for 5 minutes or greater. While some of the embodiments discussed herein remove a substantial amount of oxygen, it will be recognized that the process may be tuned remove less than a substantial amount of oxygen. Further, in some embodiments, the resulting material may be a metal oxide with a lower concentration of oxygen than the original metal oxide.

Without being bound by theory, it is hypothesized that a driving mechanism is a thermite or thermite-like reaction where a metal oxide loses its oxygen to a more active pure metal and releases heat in the process. As an example, the following formula is speculated to describe the hypothesis above:

$$5CoO + 2Ta \rightarrow 5Co + Ta_2O_5 + heat$$

Extending this hypothesis of a thermite reaction, the above noted materials may be suitable reducing agents, as well as any other materials that produce a thermite or thermite-like reaction.

As a nonlimiting example, the systems and methods for locally reducing oxides discussed herein may be utilized to synthesize magnetic thin films, such as a magnetic film providing islands of CoPd formed from localized reduction of CoOPd, which may be suitable for bit patterned media (BPM). In some embodiments, a metal may be deposited and oxidized utilizing the abovementioned deposition techniques. The resulting metal oxide will preferably demonstrate magnetic properties when oxygen is removed from the metal oxide, such as by annealing or heating. As a nonlimiting example, suitable metal oxides may include cobalt oxides, CoO, CoOPd, CoOPt, iron oxide, $Fe_2O_3$, $Fe_3O_4$, nickel oxide, or the like. Oxygen may be removed or liberated from the deposited metal oxide by low temperature annealing. In some embodiments, one or more localized areas of the metal oxide film may be heated to remove oxygen. Annealing may result in minimal displacement of the metal atoms. In some embodiments, the low temperature annealing may occur at temperatures equal to or between 100° C. to 400° C. As nonlimiting examples, any suitable method of generating heat may be utilized, such as an oven, laser, lamps, electron beams, ion beams, a hot plate, or the like. In some embodiments, the metal oxide may be annealed for 5 minutes or greater. As a nonlimiting example, CoOPd or CoO may be annealed for approximately 5 minutes. As a nonlimiting example, global annealing or annealing of the entire metal oxide film may be performed using flash lamps 5 minutes from 100 to 400° C. It will be understood by one of ordinary skill in the art that annealing time may vary significantly depending on the annealing method and/or annealing type desired (e.g. localized or global). In some embodiments, the metal oxide may be annealed for a few nanoseconds or greater. As a nonlimiting example, a pulsed laser may be utilized for local annealing at a higher temperature for time period in the nanosecond range. After the annealing, the previously metal oxide film is converted into a film providing one or more localized areas where the oxygen has been removed to form island(s) of magnetic material, such as shown in FIG. 1C. The islands may be form in any suitable shape, such as circles, squares, rectangles, ovals, or the like. In other embodiments, the entirety of the metal oxide film may be heated to remove oxygen (or globally annealing), thereby resulting in a desired magnetic film.

As a nonlimiting illustrative example, CoPd multilayers have been studied for many decades as a candidate material for high density magnetic recording. Despite research to optimize parameters to produce high quality CoPd multilayers for bit patterned media (BPM), it is difficult to produce films with low enough defect density for BPM. In some embodiments, low defect density may be 15% or less variation in switching properties. In some embodiments, low defect density may be 10% or less variation in switching properties. In some embodiments, low defect density may be 5% or less variation in switching properties. In contrast to other methods, by depositing a metal oxide, such as CoO, CoOPd, CoOPt, iron oxide ($Fe_2O_3$, $Fe_3O_4$), or nickel oxide, and subsequently reducing the metal oxide, an additional parameter may be adjusted to achieve desirable film properties. In some embodiments, the metal oxide film could be produced using common methods such as reactive sputter and or oxidation. For example, a CoO film may be produced by sputter deposition of Co in an oxygenated environment. Other methods to deposit CoO may include sputtering, evaporation, CVD, PVD, PLD, ALD, electrodeposition, or any other suitable deposition method. In another embodiment, a metal (e.g. cobalt) may be deposited using any of the abovementioned methods. The metal may then be oxidized by annealing, plasma treatment and/or exposure to oxygen.

As a nonlimiting example, a CoOPd layer may be deposited utilizing any of the methods discussed above. A reducing agent, such as Ta, may be deposited or patterned on the CoOPd layer as discussed above. The sample may then be annealed as discussed above to convert CoOPd to CoPd. In some embodiments, small regions of the sample may be annealed, such as islands, to form a matrix of magnetic CoPd islands in the CoOPd layer. In some embodiments, the CoOPd layer and/or Ta layer may be patterned into islands so that annealing results in a matrix of magnetic CoPd islands in the CoOPd layer. The resulting matrix may be suitable for bit pattern media. Tantalum is a metal that is relatively easy to reactive ion etch (RIE) compared to ferromagnetic materials. This may enable a higher fidelity pattern transferring process, which can lead to better quality bit patterned media. This is a promising alternative approach towards bit patterned media that is compatible with disk manufacturing technology.

Once a substrate with a metal oxide film is obtained, the oxygen components of the metal oxide film could be removed from the film by annealing or heat treatment. The process is unique in that it utilizes indirect approach to providing a metal film with magnetic properties, such as CoPd, multilayers.

Nonlimiting applications for the systems and methods discussed above are to fabricate CoPd multilayers or other multilayers for BPM. Various deposition processes can be used to deposit a metal oxide (e.g. CoOPd), and various annealing can utilized to remove the oxygen component of the metal oxide (e.g. CoPd film) to provide a film with desirable magnetic properties for magnetic recording. As a nonlimiting example, a CoOPd film may be locally heated to produce islands of CoPd, thereby providing a suitable film for BPM. The systems and methods provide an alternative approach towards bit patterned media (BPM) that is compatible for use with current disk manufacturing technology, such as perpendicular magnetic recording (PMR) or heat assisted magnetic recording (HAMR). In addition, this idea avoids challenging issues in BPM fabrication such as patterning, pattern transfer, and servo patterning.

As a nonlimiting example, CoOPd or CoO may be annealed for approximately 5 minutes. As a nonlimiting example, global annealing or annealing of the entire metal oxide film may be performed using flash lamps 5 minutes from 100 to 400 C. It will be understood by one of ordinary skill in the art that annealing time may vary significantly depending on the annealing method and/or annealing type desired (e.g. localized or global). These methods can be extended to other materials as well for additional technological/commercial applications. Further, nonlimiting examples may include:

1) Iron Oxide ($Fe_2O_3$, $Fe_3O_4$) can be used to produce magnetic materials such as FePt, an important material for the state-of-the-art magnetic recording;

2) Copper Oxide (CuO, $Cu_2O$), an insulator, can be reduced to Cu which is a conductor;

3) $TiO_2$ has many useful applications such as photocatalyst, high refractive index (2.5-2.9), and optical recording, and the oxygen concentration may be tuned using the methods discussed;

4) Other thermite reactants that can potentially produce desirable materials using this process include, but are not limited to: tin oxide, manganese oxide, chromium oxide, nickel oxide, silver oxide, and molybdenum oxide.

Experimental Example

The following examples are included to demonstrate particular aspects of the present disclosure. It should be appreciated by those of ordinary skill in the art that the methods described in the examples that follow merely represent illustrative embodiments of the disclosure. Those of ordinary skill in the art should, in light of the present disclosure, appreciate that many changes can be made in the specific embodiments described and still obtain a like or similar result without departing from the spirit and scope of the present disclosure.

CoO and CoOPd multilayers were deposited on a substrate, and the films was subjected to low temperature annealing at various temperatures to reduce the film to Co and CoPd multilayers respectively. One of the key features of this technology is the liberation of the oxygen with minimal displacement of the Co atoms. Annealing was performed at temperatures from 100° C. to 400° C. using a rapid thermal processing furnace. However, in other embodiments, various ways of generating heat on the film surface may be utilized, such as, but not limited to, oven, laser, lamps, electron beams and ion beams.

Figure 3:
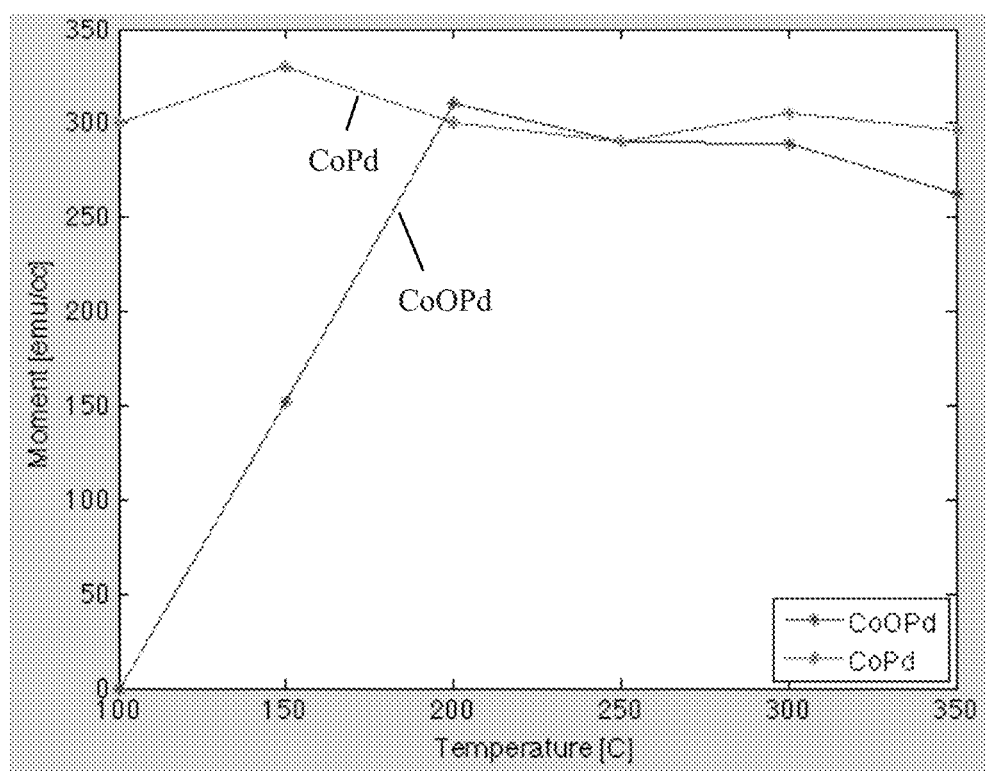
FIG. 3 shows the magnetic moment of CoPd and CoOPd films after annealing at various temperatures.

FIG. 2 shows the magnetic moment of Co and CoO films after annealing at various temperatures. As shown, the magnetic moment of CoO film is zero as deposited. After heating the film at 150° C. by rapid thermal processing for 5 minutes, the magnetic moment of the CoO film increased to approximately 1000 emu/cc or approached the magnetic moment of pure Co. Extended heating or heating at higher temperature did not have any further effect on the magnetic moment of the film. FIG. 3 shows the magnetic moment of CoPd and CoOPd films after annealing at various temperatures. The magnetic moment of CoOPd film is zero as deposited, but after 5 minutes of annealing at 150° C., the magnetic moment increased to approximately 150 emu/cc. After 5 minutes of annealing at 200° C., the moment of CoOPd film was approximately equivalent to as deposited CoPd film. After annealing, the film remained stable and retained its new magnetic properties.

Figure 4:
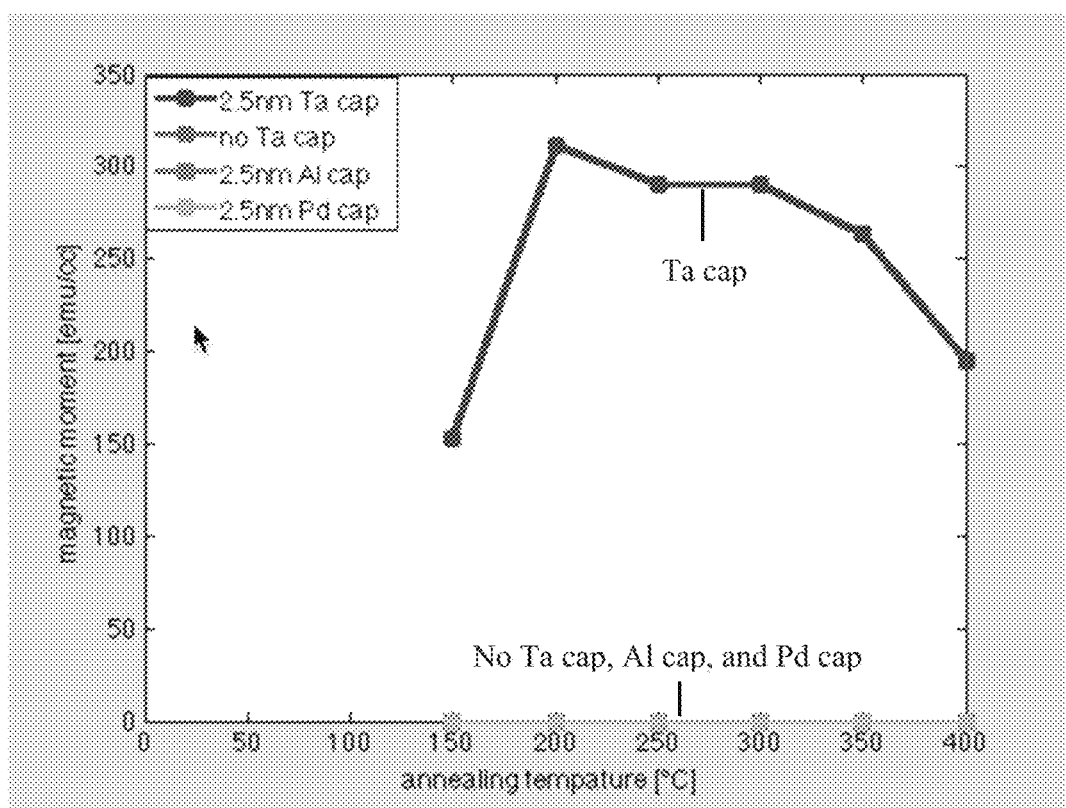
FIG. 4 shows the magnetic moment of materials when annealing of a CoOPd film without any cap, Ta cap, Al cap, and Pd cap.

In some embodiments, a reducing agent, such as tantalum, may play a significant role in the reduction of metal oxide, such as CoOPd to CoPd. FIG. 4 shows the magnetic properties of CoOPd multilayer films that are reactively sputtered on a seed layer of 15 nm thick palladium and capped with 2.5 nm thick of the following materials: nothing, tantalum, palladium, aluminum. Upon annealing for 5 minutes at temperatures up to 400 C, it was observed that only the sample with a tantalum cap produced a magnetic signal. This drastic change in magnetic properties is observed in the presence of a tantalum cap, whereas other materials (no Ta cap, Al cap, and Pd cap) did not produce magnetic properties. Therefore, we speculate that tantalum is stealing the oxygen from CoOPd, which is nonmagnetic, and reducing it to CoPd, which is magnetic. While Al and Pd did not reduce the CoOPd layer to CoPd at the temperature range shown, it is noted that such materials may require higher temperature annealing. For example, it is contemplated that Al may require temperatures of approximately 1800° C. to initiate a thermite reaction.

Embodiments described herein are included to demonstrate particular aspects of the present disclosure. It should be appreciated by those of skill in the art that the embodiments described herein merely represent exemplary embodiments of the disclosure. Those of ordinary skill in the art should, in light of the present disclosure, appreciate that many changes can be made in the specific embodiments described and still obtain a like or similar result without departing from the spirit and scope of the present disclosure. From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure.

What is claimed is:

1. A method for reducing a metal oxide layer, the method comprising:
depositing a metal oxide layer on a substrate;
depositing a reducing agent on the substrate to aid removal of oxygen from the metal oxide layer; and
annealing the substrate to remove oxygen from the metal oxide layer, wherein the annealing step comprises heating localized areas to pattern the metal oxide layer thereby resulting in the metal oxide layer providing one or more patterned islands with oxygen removed, wherein further the metal oxide layer is a cobalt oxide, CoO, CoOPd, CoOPt, $Fe_2O_3$, $Fe_3O_4$, iron oxide, $TiO_2$, tin oxide, manganese oxide, chromium oxide, nickel oxide, silver oxide, or molybdenum oxide, and the annealing results in a change in magnetism, conductivity, photocatalyst, or refractive index properties of the metal oxide layer.

2. The method of claim 1, wherein the metal oxide layer is a patterned layer.

3. The method of claim 1, wherein the reducing agent is deposited before, after, or both before and after the metal oxide layer.

4. The method of claim 1, wherein the reducing agent is Ta, Al, Mg, Ca, Zr, Zn, Ti, Si, or C.

5. The method of claim 1, wherein an annealing time is equal to or between 0.1 nanoseconds to 24 hours.

6. The method of claim 1, wherein an annealing time is 5 minutes or greater.

7. The method of claim 1, wherein an annealing temperature is equal to or greater than 100° C.

8. The method of claim 1, wherein an annealing temperature is equal to or between 100-1000° C.

9. The method of claim 1, wherein an annealing temperature is equal to or between 100° C. to 500° C.

10. The method of claim 1 wherein the metal oxide layer is a cobalt oxide, CoO, CoOPd, CoOPt, iron oxide, $Fe_2O_3$, $Fe_3O_4$, or nickel oxide.

11. The method of claim 1, wherein the substrate and the annealed metal oxide layer are bit patterned media (BPM).

12. The method of claim 11, wherein the BPM has a defect density of 15% or less variation in switching properties.

13. The method of claim 11, wherein the BPM has a defect density of 10% or less variation in switching properties.

14. The method of claim 11, wherein the BPM has a defect density of 5% or less variation in switching properties.

15. The method of claim 1, wherein the annealing results in a change in magnetism, photocatalyst, or refractive index properties of the metal oxide layer.

16. A method for forming bit pattern media (BPM), the method comprising:
- depositing a media layer comprising a metal oxide on a substrate, wherein the metal oxide demonstrates magnetic properties when oxygen is removed;
- depositing a reducing agent on the media layer to aid removal of oxygen; and
- locally annealing the media layer, wherein the local annealing heats a plurality of regions of the media layer and the plurality of regions form a matrix of magnetic islands.

17. The method of claim 16, wherein the metal oxide is a cobalt oxide, CoO, CoOPd, CoOPt, iron oxide, $Fe_2O_3$, $Fe_3O_4$, or nickel oxide.

18. The method of claim 16, wherein a second reducing agent is deposited before, after or both before and after the media layer.

19. The method of claim 16, wherein the reducing agent is Ta, Al, Mg, Ca, Zr, Zn, Ti, Si, or C.

20. The method of claim 16, wherein an annealing time is equal to or between 0.1 nanoseconds to 24 hours.

21. The method of claim 16, wherein an annealing temperature is equal to or greater than 100° C.

22. The method of claim 16, wherein the BPM has a defect density of 15% or less variation in switching properties.

* * * * *